US006197639B1

United States Patent
Lee et al.

(10) Patent No.: US 6,197,639 B1
(45) Date of Patent: Mar. 6, 2001

(54) METHOD FOR MANUFACTURING NOR-TYPE FLASH MEMORY DEVICE

(75) Inventors: Hun-kyu Lee, Seoul; Jeong-hyuk Choi, Suwon, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/352,488

(22) Filed: Jul. 13, 1999

Related U.S. Application Data
(60) Provisional application No. 60/092,552, filed on Jul. 13, 1998.

(51) Int. Cl.[7] .................... H01L 21/336; H01L 21/4763; H01L 21/44
(52) U.S. Cl. .................... 438/258; 438/257; 438/618; 438/620; 438/672; 438/675
(58) Field of Search .................... 438/257, 637, 438/595, 258, 241, 597, 598, 618, 620, 621, 672, 675

(56) References Cited

U.S. PATENT DOCUMENTS

| | | | |
|---|---|---|---|
| 4,635,347 | * 1/1987 | Lien et al. | 29/591 |
| 4,933,297 | * 6/1990 | Lu | 437/41 |
| 5,206,187 | * 4/1993 | Doan et al. | 437/192 |
| 5,210,053 | * 5/1993 | Yamagata | 437/192 |
| 5,607,873 | * 3/1997 | Chen et al. | 437/51 |
| 5,607,879 | * 3/1997 | Wuu et al. | 437/193 |
| 5,702,982 | * 12/1997 | Lee et al. | 437/195 |
| 5,766,992 | * 6/1998 | Chou et al. | 438/241 |
| 5,780,336 | * 7/1998 | Son | 438/251 |
| 5,877,980 | * 3/1999 | Mang et al. | 365/185.17 |
| 5,888,887 | * 3/1999 | Li et al. | 438/525 |
| 5,926,707 | * 7/1999 | Seo | 438/238 |
| 5,946,548 | * 8/1999 | Hashimoto et al. | 438/41 |
| 6,004,841 | * 12/1999 | Chang et al. | 438/238 |

* cited by examiner

Primary Examiner—Matthew Smith
Assistant Examiner—Lex H. Malsawma
(74) Attorney, Agent, or Firm—Marger Johnson & McCollom, P.C.

(57) ABSTRACT

An improved method for fabricating a NOR flash memory device having a cell array region and a periphery region near the cell array region is disclosed. The bit line contact regions of the cell array region are formed independently, using a different mask, from the word line contact regions of the cell array region, and the active contact region and the gate contact region of the periphery region, thereby allowing stable formation of all contact regions without etching damage. Also, plug ions are implanted into the bit line contact region of the cell array region, and a metal plug is formed in the bit line contact region and the word line contact region of the cell array region, and the active contact region and the gate contact region of the periphery region.

11 Claims, 9 Drawing Sheets

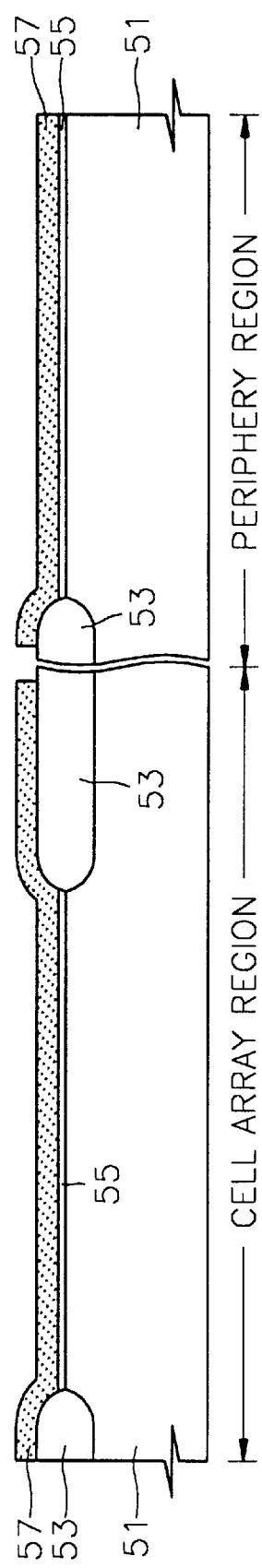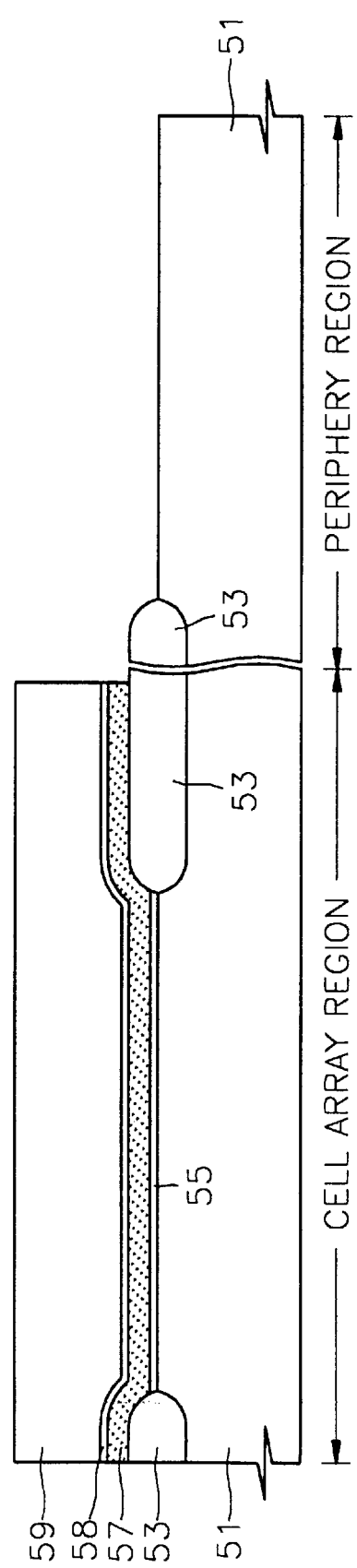

METHOD FOR MANUFACTURING NOR-TYPE FLASH MEMORY DEVICE

This application claims benefit to U.S. provisional 60/092,552 filed Jul. 13, 1998.

BACKGROUND OF THE INVENTION

1. Field of the Invention

The present invention relates to a method for fabricating a flash memory device, and more particularly, to a method for fabricating a NOR flash memory device.

2. Description of the Related Art

Among various semiconductor memory devices, a random access memory (RAM) loses data when power is interrupted. A read only memory (ROM), however, retains data even when power is interrupted. Thus, such a ROM is called a non-volatile memory device. A flash memory device is a non-volatile memory device which allows information to be electrically erased or recorded (programmed), and is widely used in computers and memory cards. The flash memory device can be either a NOR flash memory device or a NAND flash memory device. Here, a conventional NOR flash memory device will be described.

FIG. 1 shows the layout of part of a cell array of a conventional NOR flash memory device, and FIG. 2 is a section view of a unit cell of the NOR flash memory device, taken along line II—II of FIG. 2.

In the conventional NOR flash memory device of FIG. 1, a unit cell is formed in a region where a bit line (B/L) crosses a word line (W/L) at a right angle. The unit cell has a floating gate 7 and a control gate 11 stacked therein. Two unit cells are connected to a bit line (B/L) via a bit line contact region 13. Also, an active source region 15 parallel with the word line (W/L) is connected to a source line (S/L) parallel with the bit line, via a common source contact region 17. The active source region 15 is an impurity region formed by implanting impurities into a substrate 1. Also, as shown in FIG. 2, the unit cell of the conventional NOR flash memory device includes the floating gate 7, a dielectric layer 9 formed on the floating gate 7, and the control gate 11 formed on the dielectric layer 9. A tunnel oxide layer 5 is interposed between the floating gate 7 and a semiconductor substrate having a source region 3a and a drain region 3b.

In the above conventional NOR flash memory device, the active source region 15 is connected to the source line (S/L) at intervals of 16 or 32 bits, via the common source contact region 17. Accordingly, if the cell area is reduced and thus an active width "t" (see FIG. 1) of the active source region 15 is reduced, resistance of the active source region 15 increases. Thus, it is impossible to quickly discharge the current of several hundred microamperes ($\mu A$) generated during the operation of the cell.

Also, if all contact regions-the bit line contact region, the source contact region, and the word line contact region of a cell array region, and the active contact region and the gate contact region of a periphery region-are formed by a single photolithography process step, and etching is performed based on the bit line contact region or the source contact region of the cell array region, the active contact region and the gate contact region of the periphery region can be over-etched. Over-etching occurs because the step difference in the cell array region is larger than the step difference in the periphery region.

SUMMARY OF THE INVENTION

To solve above problems, it is an objective of the present invention to provide a method for fabricating a NOR flash memory device, capable of reducing etching damage, which also simplifies a process for forming a contact region of a cell array region and a periphery region.

To achieve the above objective, an improved method for fabricating a NOR flash memory device is provided. The NOR flash memory device has a cell array region including a plurality of unit cells, each having a source and a drain and formed in a region of a silicon substrate where a bit line crosses a word line at right angles, with a bit line contact region exposing each unit cell's drain connected to its bit line, and a word line contact region exposing the word line. Also, the NOR flash memory has a periphery region near the cell array region, including an active contact region exposing the silicon substrate and a gate contact region exposing a gate, wherein the bit line contact region of the cell array region is formed independently, using a different mask, from the word line contact region of the cell array region, and the active contact region and the gate contact region of the periphery region. Preferably, plug ions are implanted into the bit line contact region of the cell array region, and a metal plug is formed in each bit line contact region and word line contact region of the cell array region, and in each active contact region and gate contact region of the periphery region.

Also, there is provided a method for fabricating a NOR flash memory device having a cell array region including a plurality of unit cells, each having a source and a drain and formed in a region of a silicon substrate where a bit line crosses a word line at right angles, with a bit line contact region exposing each unit cell's drain connected to its bit line, and a word line contact region exposing the word line, wherein the bit line contact region of the cell array region is formed independently, using a different mask, from the word line contact region of the cell array region. Preferably, plug ions are implanted into the bit line contact region of the cell array region, and a metal plug is formed in each bit line contact region and the word line contact region of the cell array region.

In the present invention, a word line contact region of a cell array region, and an active contact region and a gate contact region of a periphery region are formed after the fabrication of a bit line contact region of a cell array region. Thus, the contact regions can be stably formed without etching damage.

BRIEF DESCRIPTION OF THE DRAWINGS

The above objective and advantages of the present invention will become more apparent by describing in detail a preferred embodiment thereof with reference to the attached drawings in which:

FIGS. 4 through 12 are section views taken along line IV—IV of FIG. 3, illustrating a method for fabricating the NOR flash memory device having a cell array region and a periphery region according to the present invention.

DESCRIPTION OF THE PREFERRED EMBODIMENT

Figure 1:
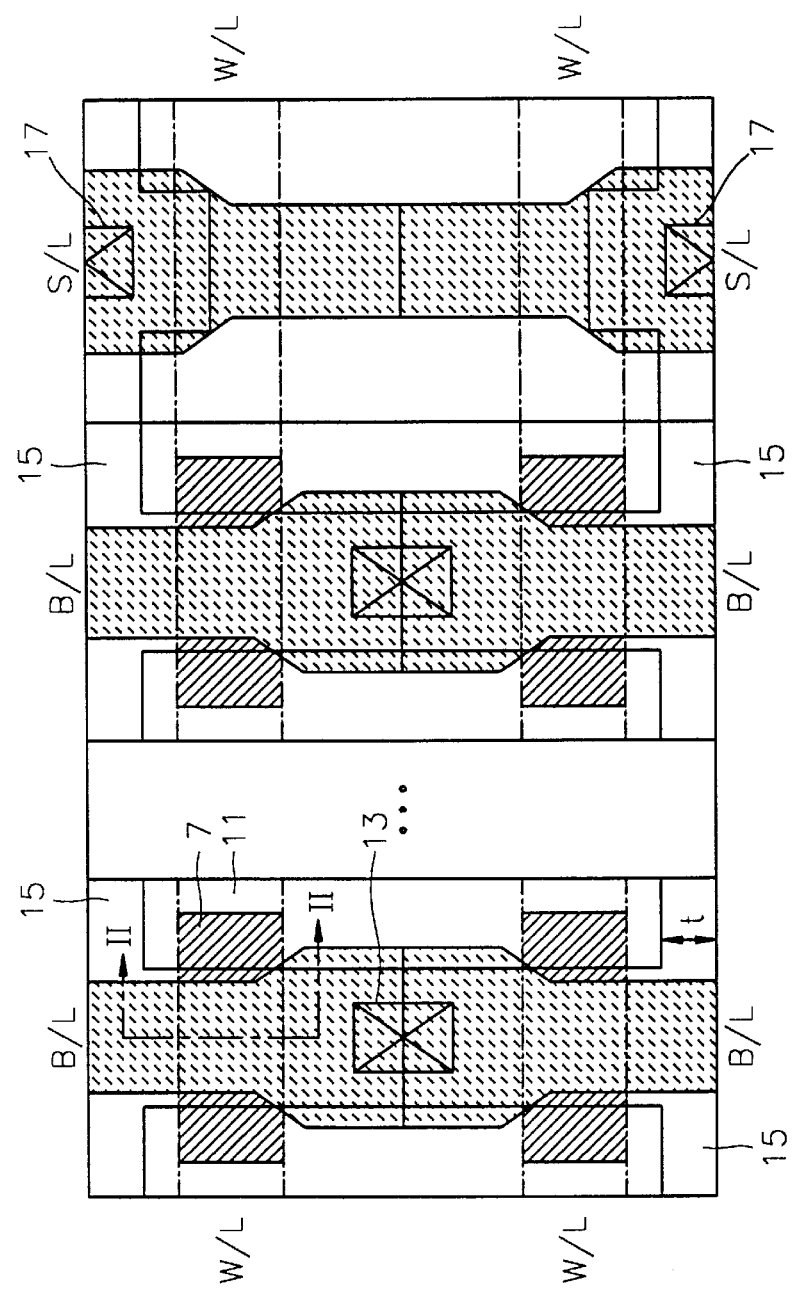
FIG. 1 is a layout diagram of part of a cell array of a conventional NOR flash memory device.
Figure 2:
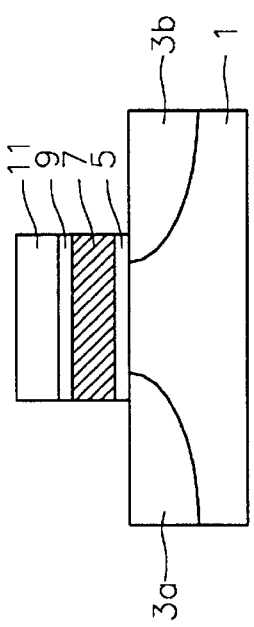
FIG. 2 is a section view of a unit cell of the conventional flash memory device, taken along line II—II of FIG. 1.
Figure 3:
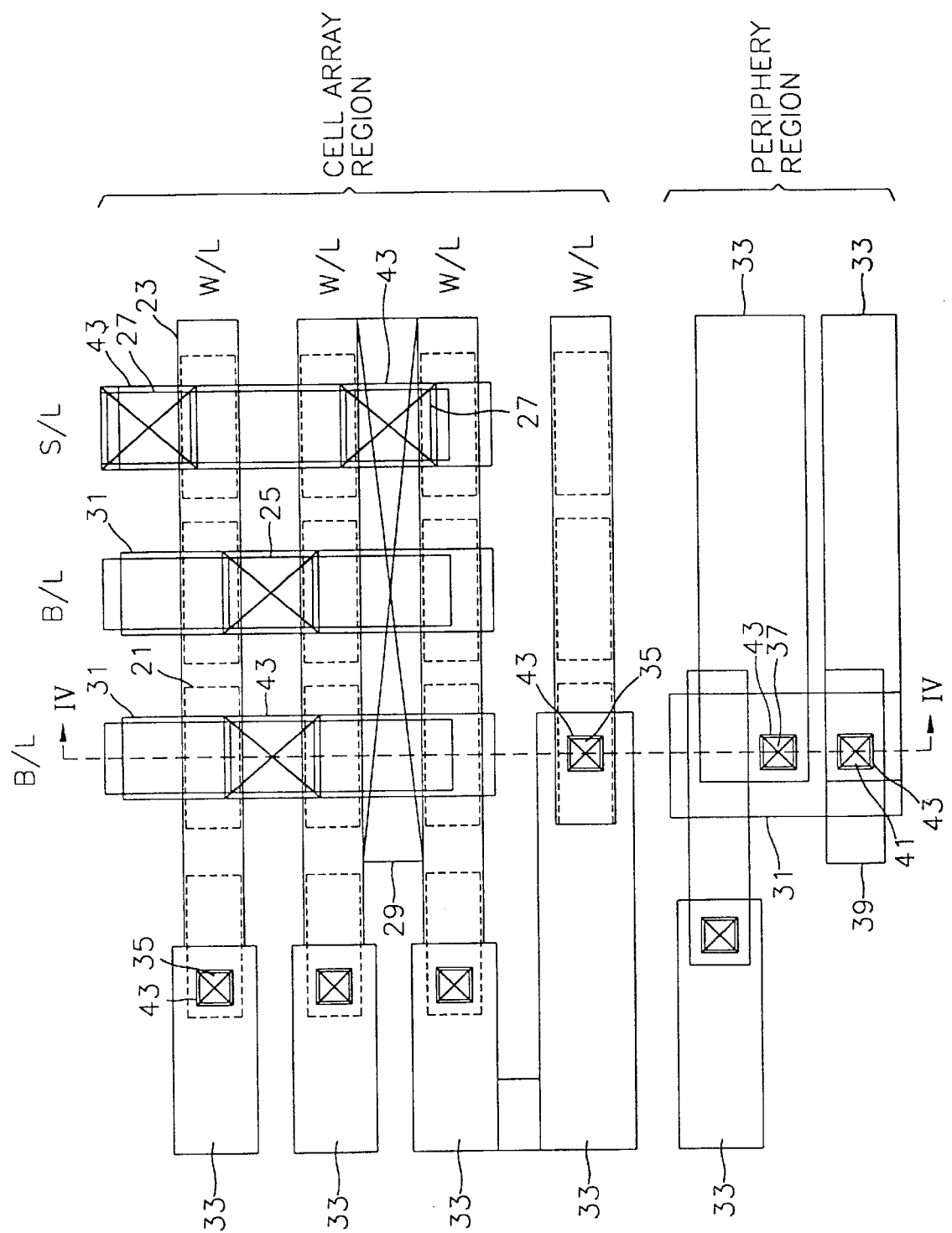
FIG. 3 is a layout diagram of a cell array region and a periphery region of a NOR flash memory device, according to the present invention.

In FIG. 3, a unit cell is formed in the cell array region. The unit cell is structured such that a floating gate 21 and a control gate 23 acting as a word line are stacked in an active region where a bit line (B/L) crosses a word line (W/L) at right angles. Two unit cells are connected to bit lines via a bit line contact region 25. Also, a source line (S/L) which is parallel to the bit line is connected to a source region formed on a silicon substrate via a source contact region 29 and a common source contact region 27.

In particular, in the NOR flash memory device according to the present invention, the source region is connected to a metal plug (not shown), e.g., tungsten plug, formed in the source contact region 29, to maintain low resistance, unlike a conventional flash memory device, thereby quickly discharging the several hundred microamperes generated during the operation of the cell. In the cell array region of the NOR flash memory device according to the present invention, the word line is connected to a metal layer 33 via a metal plug (not shown) formed in a word line contact region 35.

Also, in the periphery region of the flash memory device according to the present invention, the active region 31 is connected to the metal layer 33 via a metal plug (not shown) formed in an active contact region 37, and a gate 39 is connected to the metal layer 33 via a metal plug (not shown) formed in a gate contact region 41. In FIG. 3, reference number 43 represents a via contact region connecting the metal plugs to a metal layer, bit line and source line, respectively.

In particular, the bit line contact region 25 and the source contact region 29 of the cell array region of the NOR flash memory device according to the present invention are formed independently, using a different mask from the word line contact region 35 of the cell array region and the active contact region 37 and the gate contact region 41 of the periphery region.

A method for fabricating the NOR flash memory device having a cell array region and a periphery region according to the present invention will now be described with reference to FIGS. 4 through 12.

Referring to FIG. 4, a field oxide layer 53 is formed on a silicon substrate 51 to define an active region. Then, a tunnel oxide layer 55 is formed on the silicon substrate 51 having the field oxide layer 53 and the active region, to a thickness of 100 Å. A first polysilicon layer 57 for forming a floating gate is formed on the tunnel oxide layer 55. Then, impurities are doped on the first polysilicon layer 57 to make the layer conductive. Such impurity doping can be performed by ion implantation using phosphoryl chloride ($POCl_3$) gas, or N-type impurity ions e.g., phosphorous (P) or arsenic (As).

Then, the first polysilicon layer 57 is patterned to cover the respective active region (31 of FIG. 3) and a portion of the adjacent field oxide layer 53 of the cell array region while extending in a bit line direction, and separated from the adjacent first polysilicon layer patterns in a word line direction.

Referring to FIG. 5, an oxide-nitride-oxide (ONO) layer 58 is formed on the first polysilicon layer 57, to a thickness of 60/80/40 Å. Then, a first photoresist pattern 59 exposing the periphery region is formed on the ONO layer 58. Subsequently, the ONO layer 58, the first polysilicon layer 57 and the tunnel oxide layer 55 of the periphery region are removed through etching, using the first photoresist pattern 59 as an etching mask.

Figure 6:
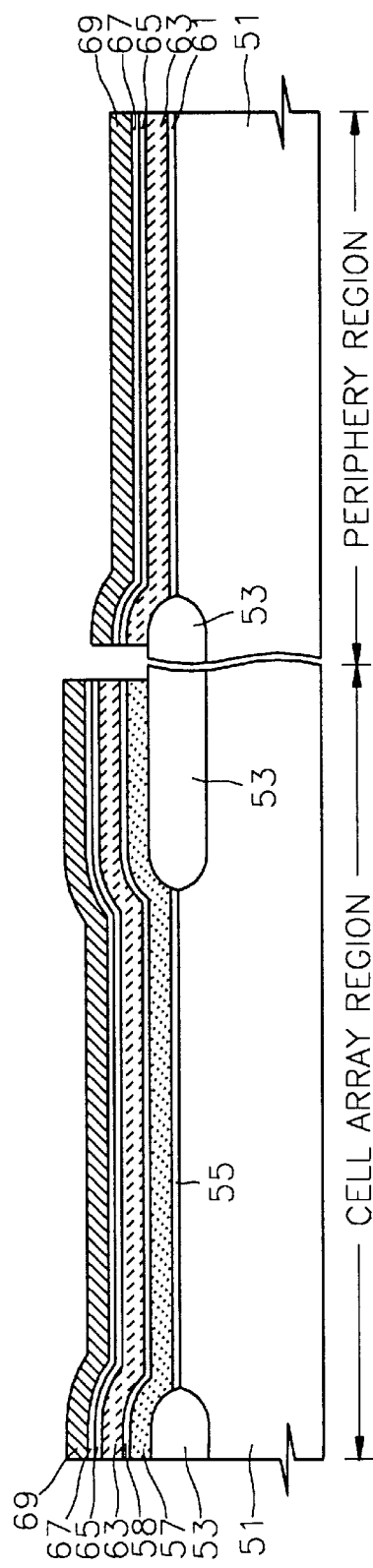

Referring to FIG. 6, the first photoresist pattern 59 used as the etching mask is removed. Then, after forming a gate oxide layer 61 in the periphery region, a second polysilicon layer 63 and a tungsten silicide layer 65, as a control gate, are formed in the cell array region and the periphery region. After forming an anti-reflective layer 67 using SiON on the tungsten silicide layer 65, in order to prevent irregular reflection, a nitride layer 69 is formed on the anti-reflective layer 67 to a thickness of 2,000~4,000 Å. Even though the nitride layer 69 is used in this embodiment, a dual layer including nitride and oxide layers or an oxynitride layer can be used. The nitride layer 69 acts as an etch stopper, preventing the gate from being exposed, because it has a slower etch rate than an oxide layer, during dry-etching of an interlayer dielectric (ILD) film, performed to form a self-aligned contact in a cell array.

Figure 7:
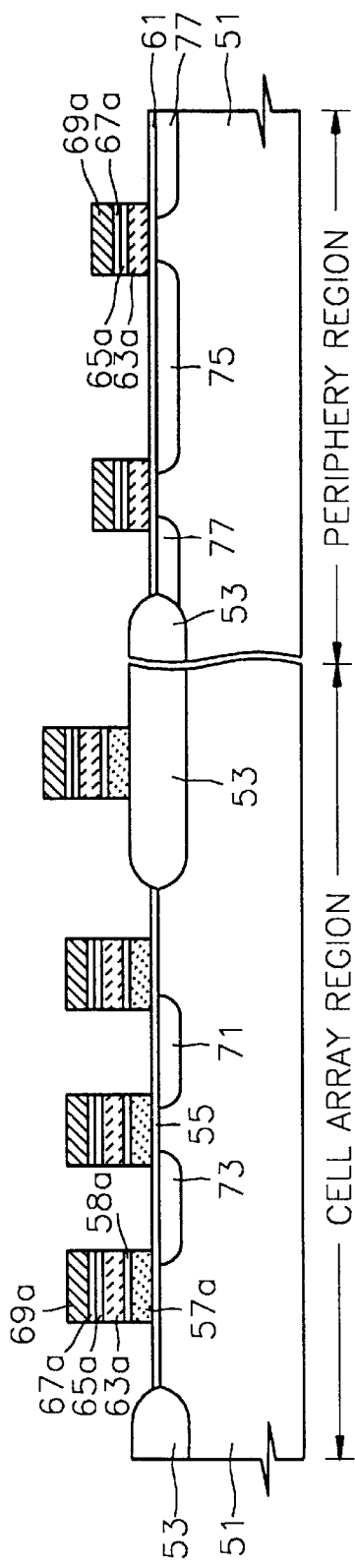

Referring to FIG. 7, after forming a photoresist pattern (not shown) to cover the periphery region, the nitride layer 69, the anti-reflective layer 67, the tungsten silicide layer 65, the second polysilicon layer 63, the dielectric layer 58 and the first polysilicon layer 57 of the cell array region are patterned by photolithography. As a result, a floating gate formed of the first polysilicon layer pattern 57a, a dielectric layer pattern 58a, a control gate including a tungsten silicide layer pattern 65a and a second polysilicide layer pattern 63a, an anti-reflective layer pattern 67a and a nitride layer pattern 69a are formed, thereby completing a stack gate in the cell array region of the silicon substrate 51.

After forming a photoresist pattern (not shown) to cover the cell array region, the nitride layer 69, the anti-reflective layer 67, the tungsten silicide layer 65 and the second polysilicon layer 63 of the periphery portion are patterned by a photolithography process. As a result, a nitride layer pattern 69a, an anti-reflective layer pattern 67a, a gate including a tungsten silicide layer pattern 65a and a second polysilicon layer pattern 63a are formed, thereby completing a gate in the periphery region of the silicon substrate 51.

Then, ions are implanted to form a source 71 and a drain 73 in the cell array region, and a source 77 and a drain 75 of an N- or P-type MOS transistor in the periphery region. In this embodiment, ion implantation for forming the sources and drains is performed before spacers are formed. However, such ion implantation may be performed after forming spacers, according to the structure in each junction region.

Figure 8:
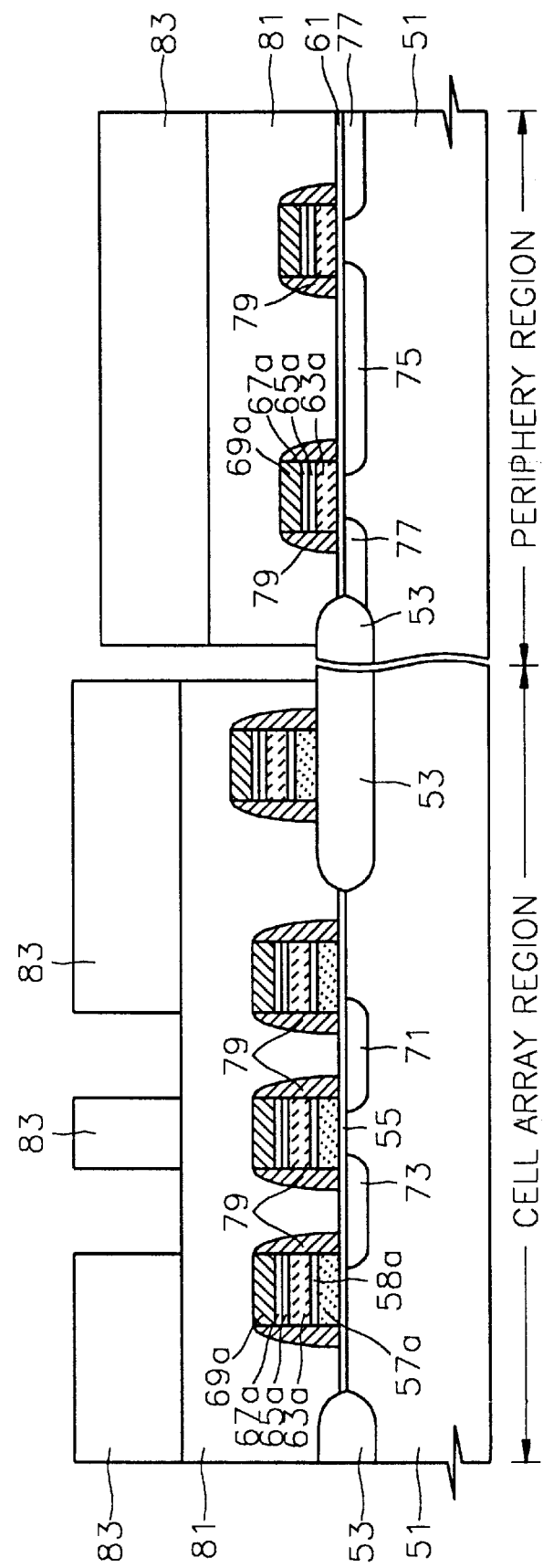

Referring to FIG. 8, a spacer 79 is formed of nitride on both side walls of the stack gate in the cell array region and the gate in the periphery region. The spacer 79 is formed by forming a nitride layer over the entire surface of the silicon substrate 51 having the stack gate and the gate, to a thickness of 50~1,000 Å, and then etching back the nitride layer. Subsequently, a first ILD layer 81 is formed on the entire surface of the silicon substrate 51 having the spacer 79, to cover the stack gate and the gate. The first ILD layer 81 is obtained by forming a high temperature oxide layer and a boro-phospho-silicate-glass (BPSG) layer to a thickness of 500~1,000 Å and 4,000~6,000 Å, respectively, and then performing a reflow process at 800° C. for 10~20 minutes. A second photoresist pattern 83 defining a bit line contact region and a source contact region of the cell array region is formed.

Figure 9:
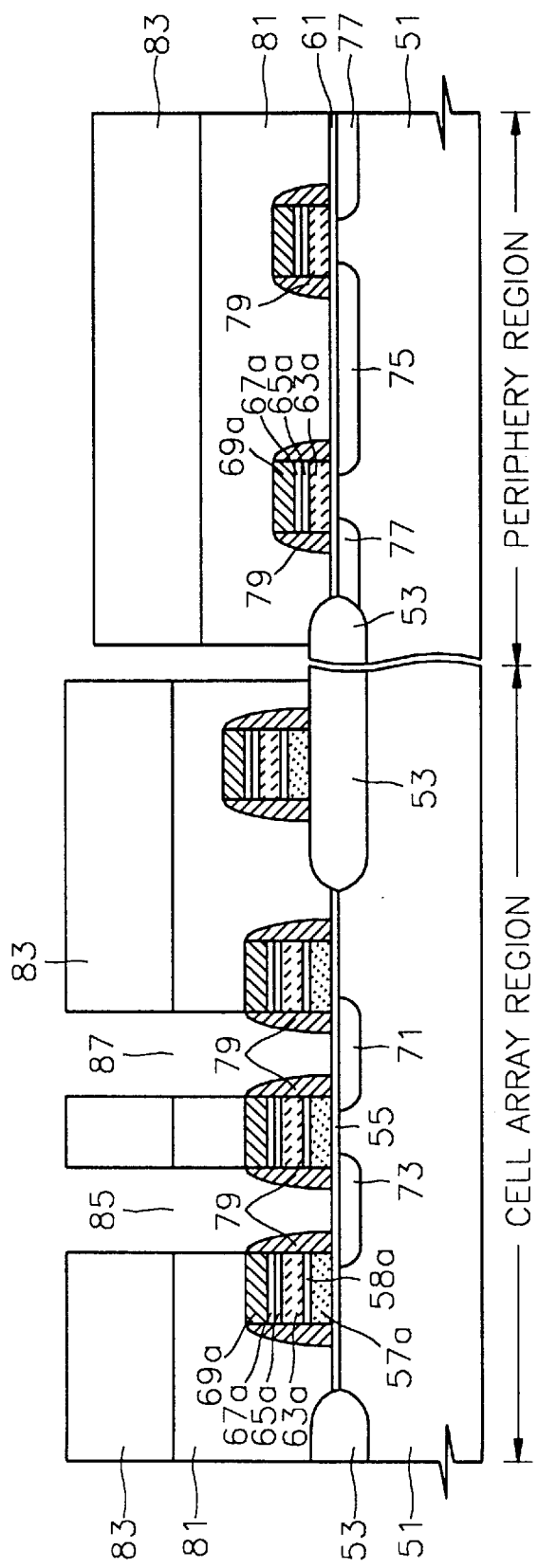

Referring to FIG. 9, the first ILD layer 81 of the cell array region is anisotropically etched using the second photoresist pattern 83 as an etching mask, thereby exposing a bit line contact region 85 and a source contact region 87. Here, the nitride layer pattern 69a and the spacer 79 covering the stack gate act as an etch stopper during a self-aligned contact process, such that a bit line contact region and a source contact region can be easily formed with very small design rules.

Then, plug ion implantation is performed using As or P at a dose of $5\times10^{-13}\sim1\times10^{-14}$ ions/cm$^2$ on the bit line contact region 85 and the source contact region 87, re-using the second photoresist pattern 83 as an ion implantation mask. The plug ion implantation is performed during the formation of a highly-integrated flash memory device to reduce contact resistance by overlapping the impurity regions of the bit line contact region, the source contact, and the source and drain regions.

Figure 10:
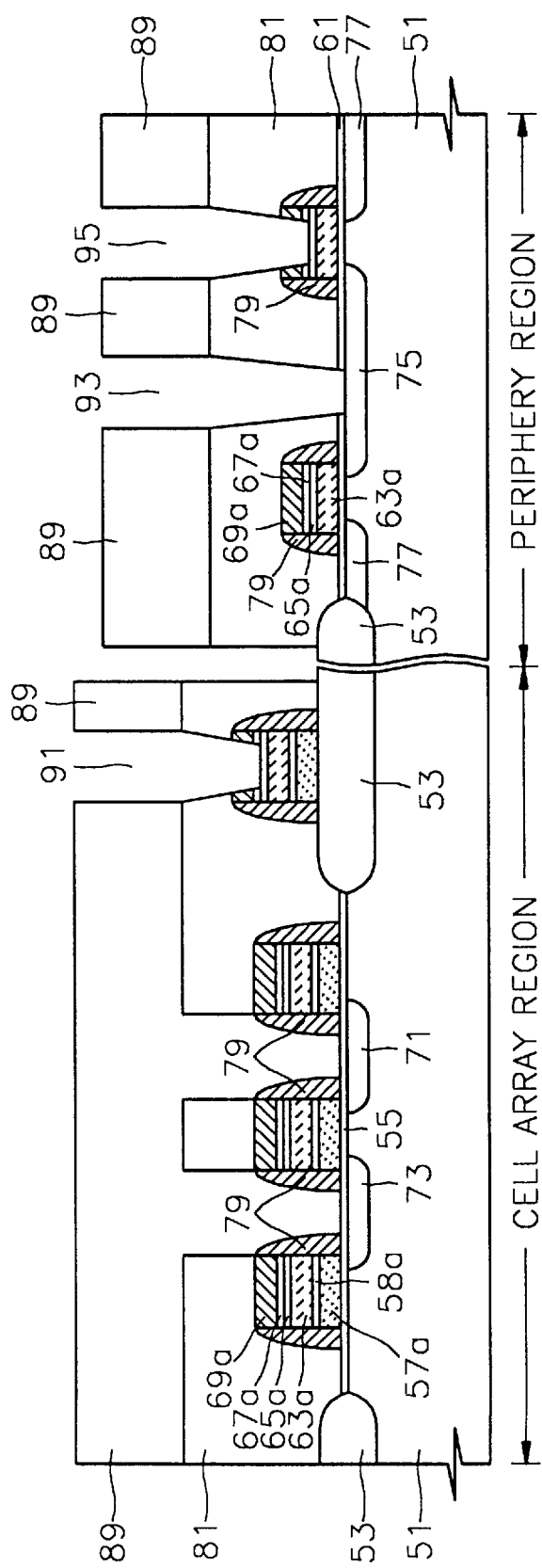

Referring to FIG. 10, after removing the second photoresist pattern 83, a photoresist layer is formed on the first ILD layer 81, and then patterned to form a third photoresist pattern 89, as an etching mask to form the contact region for exposing the surfaces of the stack gate formed on the field oxide layer of the cell array region, and of the drain region and the gate of the periphery region.

Then, the first ILD layer 81, the nitride layer pattern 69a and the anti-reflective layer pattern 67a of the cell array region and the periphery region are etched using the third photoresist pattern 89 as an etching mask, resulting in a word line contact region 91, an active contact region 93 and a gate contact region 95.

The word line contact region 91, the active contact region 93 and the gate contact region 95 each have a similar etching depth, and thus very high etch selectivity between the oxide layer and the nitride layer is not required. Thus, the contact process of FIG. 10 is performed independently from previous self-aligned contact processes that applied to a structure having a large step difference, thereby reducing etching damage.

In other words, if all contact regions-the bit line contact region, the source contact region, and the word line contact region of a cell array region, and the active contact region and the gate contact region of a periphery region-are formed by a single photolithography process step, and etching is performed based on the bit line contact region or the source contact region of the cell array region, the active contact region and the gate contact region of the periphery region can be over-etched. Over-etching occurs because the step difference in the cell array region is larger than the step difference in the periphery region. As a result, the source and the drain of the periphery region are over-etched or the gate is completely removed. However, the fabrication method of a NOR flash memory device according to the present invention can suppress such etching damage.

Figure 11:
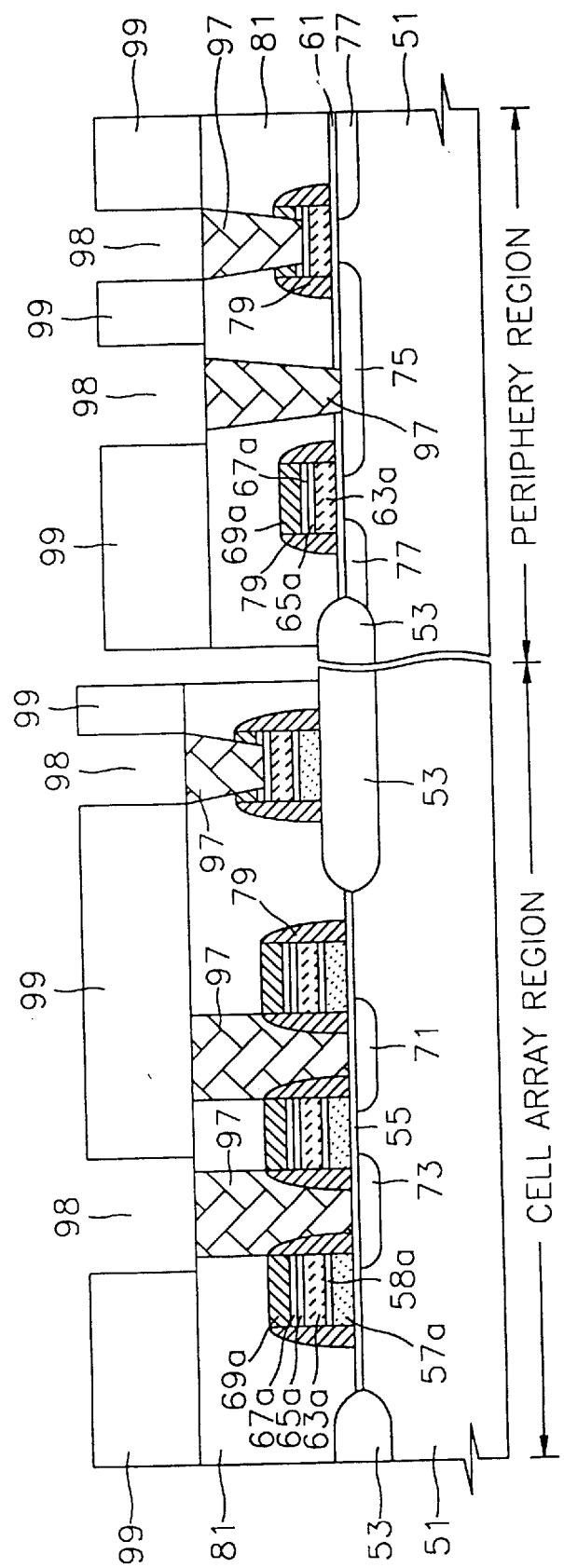

Referring to FIG. 11, after removing the third photoresist pattern 89, metal plugs 97 are formed such that the bit line contact region 85, the source contact region 87 shown in FIG. 9 and the word line contact region 91 of the cell array region and the active contact region 93 and the gate contact region 95 of the periphery region shown in FIG. 10 are buried. The source contact region connecting the source regions of adjacent cells is formed as a metal layer so that resistance can be reduced, as described with reference to FIG. 3. In this embodiment, the metal plugs 97 are formed of tungsten. Then, a second ILD layer 99 having via holes 98 exposing the metal plug 97 is formed on the first ILD layer 81.

Figure 12:
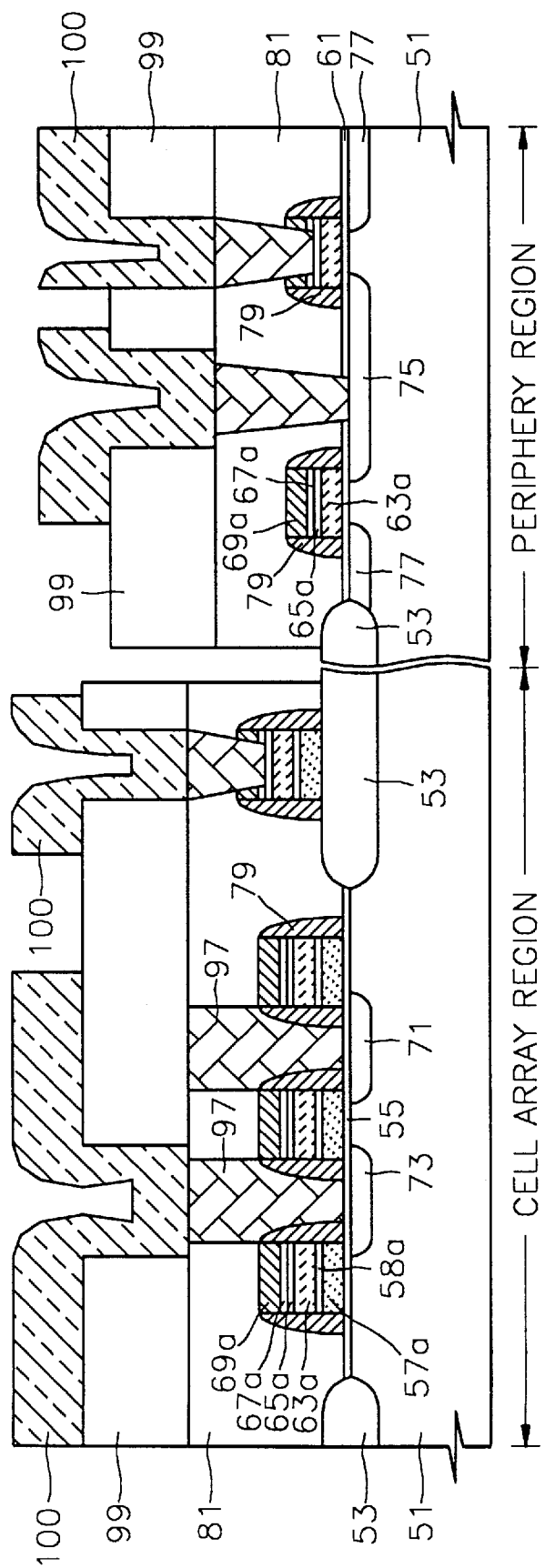

Referring to FIG. 12, a metal layer (not shown), e.g., an aluminum (Al) layer, is formed in the via holes 98 of FIG. 11, and then patterned to form metal layer patterns 100, thereby completing the NOR flash memory device according to the present invention.

As described above, in the present invention, the source regions of the cell array regions are connected by a metal layer, thereby reducing resistance. Also, the bit line contact region and the source contact region of the cell array region can be effectively formed, even with very small reduced design rules, through a self-aligned contact process. In addition, the word line contact region of the cell array region and the active contact region and the gate contact region of the periphery region are formed after the fabrication of the bit line contact region and the source contact region of the cell array region, so that the contact regions can be stably formed without etching damage.

While the present invention has been illustrated and described with reference to a specific embodiment, further modifications and alterations within the spirit and scope of this invention will occur to those skilled in the art.

What is claimed is:

1. A method for fabricating a NOR flash memory device, comprising:
   (a) forming a plurality of stack gates, each of the stack gates including a tunnel oxide layer, a floating gate, a dielectric layer, a control gate and an etch stopping layer which are stacked in sequence, and a plurality of gates, each of the gates including a gate oxide layer, a gate and an etch stopping layer which are stacked in sequence, respectively in a cell array region and a periphery region of a silicon substrate;
   (b) forming source and drain regions in the silicon substrate having the stack gates and the gates;
   (c) forming spacers on both side walls of the stack gates and the gates;
   (d) forming a first interlayer dielectric (ILD) layer on the stack gates and gates;
   (e) forming a first photoresist pattern on the first ILD layer to expose a portion of the silicon substrate between the stack gates;
   (f) forming a bit line contact region and a source contact region aligned with the spacers by etching the first ILD layer using the first photoresist pattern as an etching mask, the bit line contact region having a first depth;
   (g) removing the first photoresist pattern;
   (h) forming a second photoresist pattern to expose the stack gates formed on a field oxide layer in the cell array region and an active region and the gates in the periphery region;
   (i) etching the first ILD layer and the etch stopping layer using the second photoresist pattern as a mask in order to form a word line contact region in the cell array region and form an active contact region and a gate contact region in the periphery region, the gate contact region having a second depth, after forming the bit line contact region, to prevent over-etching damage, the first depth being different from the second depth; and
   (j) concurrently forming a metal plug in each of the bit line contact region, the source contact region, the word line contact region, the active contact region and the gate contact region.

2. The method of claim 1, further comprising the step of implanting plug ions into the bit line contact region and the source contact region, before the step (g) of removing the first photoresist pattern.

3. The method of claim 1, wherein the spacers are a nitride layer.

4. The method of claim 1, wherein the metal plug is formed of tungsten.

5. The method of claim 1, further comprising, after the step (j) of forming the metal plug, the steps of:
   forming a second ILD layer having a via hole exposing the metal plug; and forming a metal layer in the via hole.

6. The method of claim 1, wherein the etch stopping layer is selected from the group consisting of a nitride layer, a dual layer including a nitride layer and an oxide layer, and an oxynitride layer.

7. A method for fabricating a flash memory device having a cell array region including a plurality of unit cells, each of the unit cells having a source and a drain and formed in a region of a silicon substrate where a bit line crosses a word line, with a bit line contact region exposing each unit cell's drain connected to the bit line, the bit line contact region having a first depth, and a word line contact region exposing the word line, and a periphery region near the cell array region, including an active contact region exposing the silicon substrate and a gate contact region exposing a gate, the gate contact region having a second depth, the first depth being different from the second depth, comprising:

forming the bit line contact region of the cell array region using a first mask, forming the word line contact region of the cell array region and the active contact region and the gate contact region of the periphery region using a second mask so as to prevent over-etching damage; and concurrently forming a metal plug in each bit line contact region and word line contact region of the cell array region, and in each active contact region and gate contact region of the periphery region.

8. The method of claim 7, wherein plug ions are implanted into the bit line contact regions of the cell array region.

9. A method for fabricating flash memory device having a cell array region including a plurality of unit cells, each having a source and a drain and formed in a region of a silicon substrate where a bit line crosses a word line, with a bit line contact region exposing unit cell's drain connected to the bit line, the bit line contact region having a first depth, and a word line contact region exposing the word line, the word line contact region having a second depth, the first depth being different from the second depth, comprising:

forming the bit line contact region of the cell array region using a first mask;

forming the word line contact region of the cell array region using a second mask so as to prevent over-etching damage; and concurrently forming a metal plug in each of the bit line contact region and the word line contact region of the cell array region.

10. The method of claim 9, wherein plug ions are implanted into the bit line contact region of the cell array region.

11. A method for fabricating a NOR flash memory device, comprising:

(a) forming a plurality of stack gates, each of the stack gates including a tunnel oxide layer, a floating gate, a dielectric layer, a control gate and an etch stopping layer which are stacked in sequence, and a plurality of gates, each of the gates including a gate oxide layer, a gate and an etch stopping layer which are stacked in sequence, respectively in a cell array region and a periphery region of a silicon substrate;

(b) forming source and drain regions in the silicon substrate having the stack gates and the gates;

(c) forming spacers on both side walls of the stack gates and the gates;

(d) forming a first interlayer dielectric (ILD) layer on the stack gates and gates;

(e) forming a first photoresist pattern on the first ILD layer to expose a portion of the silicon substrate between the stack gates;

(f) forming a bit line contact region having a first depth and a source contact region aligned with the spacers by etching the first ILD layer using the first photoresist pattern as an etching mask, the source contact region connecting source regions of adjacent cells;

(g) removing the first photoresist pattern;

(h) forming a second photoresist pattern to expose the stack gates formed on a field oxide layer in the cell array region and an active region and the gates in the periphery region;

(i) etching the first ILD layer and the etch stopping layer using the second photoresist pattern as a mask in order to form a word line contact region in the cell array region and form an active contact region and a gate contact region in the periphery region, the gate contact region having a second depth, the first depth being different from the second depth; and (j) forming a metal plug in each of the bit line contact region, the source contact region, the word line contact region, the active contact region and the gate contact region, the source contact region connecting two or more adjacent source regions, wherein the metal plug is formed on the source contact region to reduce resistance of the connected source regions, thereby quickly discharging currents therethrough during flash memory device operation.

* * * * *